PRESENSITIZED POSITIVE-WORKING LITHOGRAPHIC PLATE AND METHOD FOR MAKING SAME
Filed Oct. 8, 1968
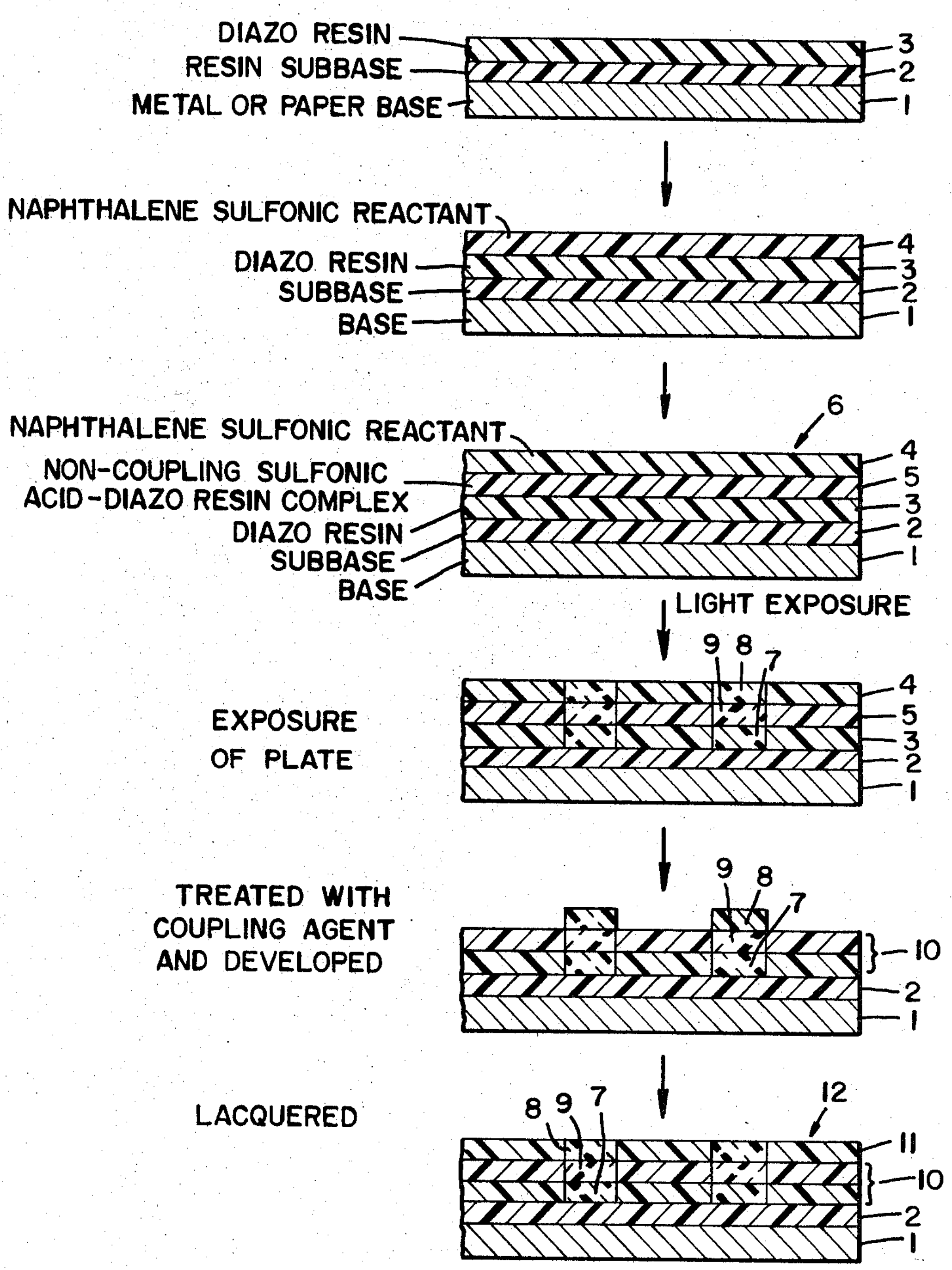
INVENTOR.
DANIEL C. THOMAS
BY
Owen, Wickersham & Erickson
ATTORNEYS United States Patent Office 3,554,751
Patented Jan. 12, 1971

3,554,751

PRESENSITIZED POSITIVE-WORKING LITHOGRAPHIC PLATE AND METHOD FOR MAKING SAME

Daniel C. Thomas, Covina, Calif., assignor to Lithoplate, Inc., Covina, Calif., a corporation of Illinois Continuation-in-part of application Ser. No. 497,416, Oct. 18, 1965. This application Oct. 8, 1968, Ser. No. 765,937
Int. Cl. G03c *1/52;* G03f *7/02*
U.S. Cl. 96—33 20 Claims

ABSTRACT OF THE DISCLOSURE

A positive-working lithographic plate utilizing in its light-sensitive surface the reaction product of a light-sensitive diazo resin and a naphthalene sulfonic reactant. The diazo resin is applied to the plate support first, and then the naphthalene sulfonic compound.

This application is a continuation-in-part of application Ser. No. 497,416, filed Oct. 18, 1965, now abandoned.

This invention relates to an improved positive-working lithographic plate.

The normal practice in preparing sensitized lithographic plates for printing is to expose the plate with a light-sensitive coating thereon to the action of actinic light through a negative of the actual pattern desired. Such plates are accordingly known in the art as "negative-working" plates, with the light exposed areas comprising the water insoluble, oleophilic surface defining the printing areas.

For many years, there has been a keen interest in producing a commercially feasible "positive-working" plate in which the image is formed by direct exposure to the original subject or through a suitable positive transparency of the original subject. One prior-art way of preparing such a plate has involved the use of a diazo compound which in its unexposed state is oleophilic and hence water insoluble but which upon exposure is converted into a water-soluble form. In such a process, the diazo material is accordingly exposed through a positive transparency, stencil or the like and thereafter developed in the usual fashion. The resulting plate, however, has as its printing or image areas unexposed diazo material and thus has the obvious disadvantage that it is still susceptible to light exposure in the printing areas, and accordingly, use of the plate on a press in a room with normal light causes the ink-carrying diazo material gradually to decompose, thus ending the useful life of the plate, particularly for high quality work.

It is therefore a principal object of the present invention to provide a positive-working surface lithographic plate which, after exposure and development, is no longer light-sensitive in either the printing or non-printing areas.

This invention provides a positive-working plate in which the image or printing areas are comprised of a water-insoluble, oleophilic light-insensitive coupled-diazo resin reaction product. The hydrophilic non-printing areas comprise the actinic-light exposure induced reaction product of a diazo resin and an overcoating over the diazo resin coated support member of a non-coupling aromatic sulfonic acid with three or more hydrophilic reactive groups consisting of acid or amine groups, to form a non-coupling-sulfonic acid-diazo resin complex intermediate between the diazo resin and the hydrophilic non-coupling sulfonic acid.

Yet another object of this invention is the provision of a lithographic plate in which the surface prior to exposure and development, will be tack free and not susceptible to damage by way of fingerprints, smudges, improper handling or the like.

An additional object of this invention is to provide a positive working lithographic plate which has a light-sensitive layer in which a color change mechanism may be incorporated so that a visible color change will be produced upon exposure to a light source.

Other objects, features and advantages of this invention will become apparent to those skilled in the art after a reading of the following more detailed description.

These and other objects are achieved by means of this invention in which a positive-working surface lithographic plate is provided comprising as its outer surface the reaction product of a water-soluble light-sensitive diazo resin and a naphthalene sulfonic reactant which may be selected from the group consisting of naphthalene sulfonic acids and monovalent metal salts thereof. As will be seen more clearly from the working examples and description which follow, such plates may be prepared by a relatively simple process and are capable of being used in standard lithographic procedures for the production of many copies without loss of reproducibility in the image areas.

To the accomplishment of the foregoing and related ends, the invention, then, comprises the features hereinafter fully described and particularly pointed out in the claims, the following description and the annexed drawing setting forth in detail a certain illustrative embodiment of the invention, this being indicative, however, of but one of the various ways in which the principle of the invention may be employed.

Referring now more particularly to the drawing, which is a schematic diagram illustrating the plate of the present invention and its process of manufacture and use, a typical supporting member 1, which preferably has a subbase layer 2 thereon, has a coating 3 of a water-soluble light-sensitive diazo resin applied thereto. After the diazo resin has been applied, a layer 4 of a hydrophilic non-coupling naphthalene sulfonic reactant which contains three or more hydrophilic acid or amine groups is applied thereto and undergoes a chemical reaction with the diazo resin 3 to form a non-coupling sulfonic acid-diazo resin complex intermediate coating 5 between the diazo resin 3 and the hydrophilic non-coupling naphthalene sulfonic reactant 4. This produces a light-sensitive positive-working lithographic plate 6.

The plate 6 is thereafter exposed to a standard source of actinic light (not shown) through a positive transparency which produces a pattern thereon corresponding to that of the transparency.

As thus illustrated, the plate has unexposed areas which are unchanged portions of the layers 3, 4, and 5 and light-exposed areas 7, 8, and 9 (corresponding to the light induced modification of layers 3, 4, and 5). The plate is thereafter treated with a coupling agent to destroy the light sensitivity of the unexposed diazo resin 3 and diazo resin-sulfonic acid reactant 5 and is treated with a developing agent to remove the hydrophilic sulfonic acid reactant 4 from the plate to form the oleophilic coupled-diazo resin reaction product 10. The exposed areas 7, 8, and 9 are insensitive to coupling as a result of light exposure. After coupling the plate is desensitized and usually lacquered. Lacquering forms a film 11 on the unexposed coupled-diazo resin 10 to enhance the oleophilic properties and mechanical strength thereof. The resultant printing plate 12 thus has as its printing areas the unexposed coupled-diazo resin areas, whereas the nonprinting areas are the exposed portions of the surface.

The support or backing member 1 for the lithographic plate 6 or 12 may be any of the standard metal or metal surfaced plates such as aluminum, zinc, copper, chromium, tin, magnesium, steel or the like. Of such metals, aluminum and zinc are preferred. The support member may also be a coated paper such as that used in the manufacture of direct image plates or photosensitive plates. Illustrative examples of such materials include paper or other sheet stock coated with an aliginate, casein, carboxy methyl cellulose or the like. Also, as per the standard technique, the paper sheet or plate may be impregnated with a thermosetting resin such as phenol formaldehyde.

Since contact with metal chemically destroys a water-soluble light-sensitive diazo material, it is customary to provide a protective barrier or sublayer 2 between such a diazo and the metal surface of the support. In the present invention, it is therefore desirable also to include such a barrier layer 2, although the invention is not restricted to the use of a sublayer or to any particular such sublayer. In general, any water-insoluble hydrophilic sublayer may be used so long as it adheres to the metal surface and does not react with the diazo compound. One type of sublayer which has been found to be suitable is that described in U.S. Pat. 3,073,723 which may comprise a water dispersible urea or melamine formaldehyde resin, a polycarboxy or polyhydroxy compound and a water-soluble metal salt. Further illustrative examples are sublayers formed from the following materials in accordance with known techniques:

(1) Polyacrylic acid, polymethacrylic acid, and water-soluble salts thereof such as the ammonium, potassium and sodium salts as well as the amides such as polyacrylamide.
(2) Carboxymethyl cellulose and carboxymethyl hydroxyethyl cellulose.
(3) Silane-acrylic acid copolymers as disclosed in U.S. Pats. 2,991,205 and 3,163,534.
(4) Modified urea-formaldehyde and melamine-formaldehyde resins as disclosed in U.S. Pats. 3,136,639 and 3,161,518.
(5) An oxide layer of aluminum as formed by the Bauer-Vogel process.
(6) Silicates such as alkali metal silicates.

Referring to the diazo resin 3, numerous water-soluble light-sensitive diazo resins may be used. One particularly suitable such resin is the condensation product of paraformaldehyde with p-diazo diphenyl amine sulphate as described in U.S. Pats. 2,679,498 and 2,100,063. Additional examples of suitable such diazo resins are the following:

The condensation product of p-anilinobenzenediazonium sulfate and formaldehyde
p,p'-Iminodibenzenediazonium chloride
N-methyl-p-anilinobenzenediazonium chloride
2,5-diethoxy-4-lauramidobenzenediazonium chloride
N,N'-trimethylenebis (p-ethylaminobenzenediazonium chloride)
p,p'-Iminodibenzenediazonium chloride reacted with formaldehyde
N-benzyl-N-ethyl-p-aminobenzenediazonium chloride
N-(2,6-dichlorobenzyl)-N-ethyl-p-aminobenzenediazonium chloride
2,5-diethyoxy-4-(p-ethoxyphenoxy) benzenediazonium chloride
4-(p-bromoanilino)-2,5-dibromobenzenediazonium chloride
p-(2,4,6-trichloroanilino) benzenediazonium chloride
4-anilino-3-(2,5-diethoxyphenylsulfamoyl) benzenediazonium chloride
2,5-dipropoxy-4-(p-tolylthio) benzenediazonium chloride.

Reference may also be made to U.S. Pats. 2,063,631; 2,667,415; 2,692,827; 2,714,066; 2,773,779; 2,778,735 and 3,030,210 for a further description of suitable materials. These materials are generally water soluble, have high molecular weight and are also, of course, light-sensitive.

The naphthalene sulfonic reactants 4 suitable for use in the present invention are, in general, non-coupling aromatic sulfonic acids with three or more hydrophilic reactive groups consisting of acid groups or amine groups or metal salts thereof. Illustrative examples include 1,3,6 and 1,3,7 naphthalene trisulfonic acid, and the metal salts of such acid, for example, the trisodium salt, or any of the other monovalent metal salts such as potassium, lithium, rubidium, etc.

Other naphthalene sulfonic acids may be used such as 1,3,5,7 naphthalene tetrasulfonic acid, and various amino disulfonic acids, such as 8-amino-1-naphthol-3,6-disulfonic acid, 3-amino-1,5-naphthalene disulfonic acid, 3-amino-2,7-naphthalene disulfonic acid, 7-amino-1,3-naphthalene disulfonic acid, 6-amino-1,3-naphthalene disulfonic acid, 8-amino-1,6-naphthalene disulfonic acid, 8-amino-1,5-naphthalene disulfonic acid, 7-amino-1-naphthol-3,6-disulfonic acid, 8-amino-1-naphthol - 5,7-disulfoic acid, and 2-diazo-1-naphthol-5-sulfonic acid, 1-diazo-2 - naphthol - 4 - sulfonic acid, and 1 - (4 - sulfo - 1 - naphthylazo)-2-naphthol-3,6 disulfonic acid or the monovalent metal salts of such acids.

The naphthalene sulfonic reactant 4 is applied as an aqueous solution and will normally have a concentration in the range of from about 0.1 to 50 percent by weight of the reactant. The preferred range is from about 1 to 5 percent. The mode of application may be any of the standard techniques such as roller coating, whirler coating, dipping, etc., and the solution is normally applied to the support at room temperature and is in contact with the support for only a short period of time as, for example one to five seconds, although both the contact time and solution temperature may be varied to a considerable extent as desired.

Coloring agents may also be included in the napthalene sulfonic solution to impart a visible color change upon exposure. Numerous compounds are suitable for this purpose, with diazo compounds being particularly suitable. The diazo compounds need not be diazo resins and normally will not be because of the oleophilic nature of such resins. Illustrative examples include the following such compounds:

p-diazo dimethylaniline zinc chloride
p-diazo diethylaniline zinc chloride
p-diazo-N-ethyl-N-hydroxyethylaniline
p-diazo-N-methyl-N-hydroxyethylaniline
4-diazo-1-morpholino benzene zinc chloride
p-diazo-N-ethyl-O-toluidine zinc chloride
p-diazo-N-diethyl-M-phenetidine zinc chloride
p-diazo-O-chloro-N-diethylaniline zinc chloride
2-diazo-1-naphthol-5-sulfonic acid
1-diazo-2-naphthol-4-sulfonic, etc.

In order to increase the contrast of the diazo image formed on exposure to light, it is also desirable to add a small amount of a dye such as Victoria Green, Methylene Blue, Naphthol Green B, Methyl Green, Alphazurine F6ND, Crystal Violet, Victoria Blue or Malachite Green. Azo dyes such as 4-phenolazo diphenyl amine may also be used if desired.

As mentioned, the coloring agent will normally be included as a part of the naphthalene sulfonic solution, and may be employed in a quantity of from about 0.1 to 50 percent by weight. The preferred range is from about 10 to 20 percent by weight.

In order for best results to be obtained, it is desirable to control the pH of the naphthalene sulfonic solution so that it is within the range of from about 1 to 5, with the range of 2 to 4 being preferred. To achieve such control, suitable additives may be used such as for example, tartaric acid when using the salts of such acids.

Although the exact chemical mechanism of the present invention is not fully understood, it is believed that the naphthalene sulfonic reactant 4 undergoes a chemical reaction through its sulfonic group or groups with the diazo resin 3 to give a light-sensitive reaction product 5 having the previously described desirable properties. It is because of this supposition that naphthalene sulfonic materials having more than one potentially reactive sulfonic group are preferred and have been found to produce better results in this invention. In any event, the order of application is important. The result desired cannot be obtained by putting the diazo resin on after the naphthalene sulfonic reactant or simultaneously with it.

The plate may be exposed to any standard source of actinic lights, preferably ultra-violet light, and the exposure time will generally be equivalent to about 10 to 100 lux units at 3000 foot candles, although this time may vary. A luxometer unit (lux) is a common analytical unit for measuring cumulative quantities of light in terms of intensity time units and is equal to 13,000 foot candle seconds of illumination, wherein the intensity of light is at least 2000 foot candles supplied by a white flame carbon arc source.

Many coupling agents may be used to couple the light-sensitive diazo material, including any of those commonly employed for such purpose. Illustrative examples of such materials include pentanedione, resorcinol, catechol, N-phenyl diethanolamine, diresorcyl sulfide, resorcinol monoacetate, cyclohexylamine, phenol, m-cresol, beta naphthylamine, titanium acetylacetonate and other similar metal chelates, and any of the well-known naphthol series, such as 2-hydroxy-3-naphthol analide (naphthal AS), etc. The couplers of the naphthol AS series are especially effective because they increase the oleophilic nature of the coupled image areas.

The present invention will be better understood by reference to the following specific but non-limiting examples.

EXAMPLE I

An aluminum sheet of the standard type used to prepare lithographic plates was cleaned of surface grease and other contaminants by immersion for 2 minutes in an aqueous solution of trisodium phosphate at 160° F. The plate was thereafter washed for about 2 minutes with tap water and was subsequently immersed for another 2 minutes in a desmutting bath of concentrated nitric acid.

Following the acid bath, the plate was again rinsed for 2 minutes with water, and a protective sublayer consisting of melamine formaldehyde, phytic acid and zirconium acetate was subsequently applied. To apply such sublayer, the plate was first immersed for about 2 minutes in an 0.55 percent aqueous solution of a melamine formaldehyde condensation resin, after which it was washed with water for approximately 2 minutes. The plate was thereafter dipped into an aqueous solution of 1.0 percent by weight phytic acid and retained therein for about 2 minutes. After rinsing in water, the plate was dipped into an 0.1 percent aqueous solution of zirconium acetate for about 2 minutes. The plate was thereafter again washed with tap water and given a final wash with deoinized water and dried.

The plate was next roller coated with a 2.0 percent aqueous solution of a diazo resin comprising the condensation product of paraformaldehyde and p-diazo diphenylamine sulfate (Fairmount Chemical Co.'s Diazo Resin #4). The plate was subsequently dried and roller coated with a 1 percent aqueous solution of the trisodium salt of 1,3,6 naphthalene trisulfonic acid having a pH of 1.8, regulated by the addition of 5 percent tartaric acid. The plate was next dried and exposed through a positive transparency for 80 lux units. The surface of the plate was not tacky or susceptible to damage by fingerprints or improper handling.

The unexposed diazo areas of the plate were next coupled by immersion of the plate in an aqueous alkaline solution having the following formulation: 100 cc. water, 10 cc. triethanolamine, 1 cc. Sterox AJ and 1 cc. 2,4-pentanedione. The plate was treated with this solution for about 1 minute after which it was removed and washed with tap water to remove the unused excess coupling agent. The plate was then lacquered with Harris Developing Lacquer M–250.

The plate produced by this example was subsequently used is a lithographic press for normal printing operations and over 40,000 copies were made without noticeable deterioration in quality due to damage to or loss of image areas.

EXAMPLE II

The general procedure of Example I was followed, except that the subbase consisted of melamine formaldehyde, a polyacrylamide and zirconium acetate. To apply this subbase, the plate was immersed in the melamine formaldehyde solution as before, after which it was washed and dipped into a 0.01 percent aqueous solution of polyacrylamide (commercially available under the trade name Cyanamer, this material having about 70 percent carboxyl groups and 30 percent amine groups). After rinsing, the plate was dipped into a zirconium acetate solution as described above.

After applying the light-sensitive diazo resin, the plate was again roller coated with the described trisodium salt solution of naphthalene trisulfonic acid.

The plate was thereafter exposed through the positive transparency, coupled and lacquered as in the preceding example. The plate thus produced was subsequently used for normal printing operations, and approximately 40,000 copies were produced without loss of image areas.

EXAMPLE III

A brush grained clean aluminum sheet was treated with a water solution of a methylated methylol melamine resin, after which it was rinsed with water and heated to about 130° C. to drive off the water and further cure the resin to a water-insoluble film thus defining a protective sublayer over the aluminum sheet. A 1.0 percent by weight solution of the previously described paraformaldehyde-diazo condensation resin was roller coated over the sublayer and permitted to dry.

The diazo coated plate was then roller coated with an aqueous solution of 1 percent Amaranth dye [the trisodium salt of 1-(4-sulfo-1-naphthyazo)-2-naphthol-3,6-disulfonic acid] and 5 percent tartaric acid. Upon exposure to ultra-violet light for approximately 3000 foot candles for about 1.5 minutes through a positive transparency, the plate was immersed for 2 minutes in an aqueous coupling solution comprising 1 cc. of pentanedione, 3 grams of triaminoethanol and 98 cc. of deionized water. The plate was subsequently desensitized to remove any residual coupling agent and was thereafter lacquered as in the preceding examples. The plate thus produced was subsequently used in a lithographic press and produced over 1000 copies with no noticeable deterioration in quality at which time the run was terminated as demonstrating satisfactory performance.

Other modes of applying the principle of the invention may be employed, change being made as regards the details described, provide the features stated in any of the following claims, or the equivalent of such, be employed.

I claim:

1. A positive-working lithographic plate comprising a support member and a light-sensitive layer overlying said support member consisting essentially of the reaction product of a water-soluble light-sensitive diazo resin overlying said support member and a naphthalene sulfonic reactant overlying said diazo resin and reacting with it and selected from the group consiting of water-soluble hydrophilic non-coupling naphthalene trisulfonic and tetrasulfonic acids having at least three hydrophilic acid groups and monovalent metal salts thereof.

2. The lithographic plate of claim 1 in which the naphthalene sulfonic reactant is naphthalene trisulfonic acid.

3. The lithographic plate of claim 1 in which said naphthalene sulfonic reactant is the trisodium salt of naphthalene trisulfonic acid.

4. The lithographic plate of claim 1 in which said support member is a metal plate.

5. The lithographic plate of claim 1 in which a protective water-insoluble hydrophilic sublayer is provided between said support member and said light-sensitive layer.

6. The lithographic plate of claim 5 in which said sublayer is formed from ureaformaldehyde, phytic acid and zirconium acetate.

7. The lithographic plate of claim 1 in which said diazo resin consists essentially of a condensation product of paraformaldehyde with p-diazo diphenylamine sulphate.

8. The lithographic plate of claim 1 in which said naphthalene sulfonic reactant was applied as an aqueous solution containing aproximately 0.1 to 50 percent by weight of said naphthalene sulfonic compound.

9. The lithographic plate of claim 1 in which said naphthalene sulfonic reactant includes a coloring agent.

10. A positive-working lithographic plate comprising a support member and a light-sensitized layer overlying said support member consisting essentially of the light exposed and coupled reaction product of a water-soluble light-sensitive diazo resin next to said support member and a hydrophilic non-coupling naphthalene sulfonic reactant over said resin and selected from the group consisting of naphthalene trisulfonic and tetrasulfonic acids having at least three hydrophilic acid groups and monovalent metal salts thereof.

11. A positive-working lithographic plate comprising a metal surfaced plate, a water-insoluble hydrophilic sublayer and a light-sensitive layer overyling said plate consisting essentially of the reaction product of a water-soluble light-sensitive diazo resin on said sublayer and hydrophilic non-coupling naphthalene trisulfonic acid on said diazo resin, said acid having at least three hydrophilic acid groups.

12. The plate of claim 11 in which said naphthalene trisulfonic acid was applied as an aqueous solution in a concentration of from about 0.1 to 50 percent by weight.

13. In a method of preparing a positive working lithographic plate, the steps comprising applying an aqueous solution of a hydrophilic non-coupling naphthalene sulfonic reactant selected from the group consisting of naphthalene sulfonic acids having at least three hydrophilic acid or amine groups and monovalent metal salts thereof to a support member previously coated with a water-soluble light-sensitive diazo resin whereby such naphthalene sulfonic reactant reacts with such diazo resin to produce a light-sensitive surface on such support member, subsequently exposing selected areas of the reaction product of such diazo resin and naphthalene sulfonic reactant to actinic light, and thereafter treating the unexposed areas with a coupling agent to destroy the light sensitivity thereof and form the ink-attractive coupled image areas of said plate.

14. The method of claim 13 in which the plate is subsequently lacquered to enhance the olephilic properties of the unexposed and coupled image areas.

15. The method of claim 13 in which said naphthalene sulfonic reactant is naphthalene trisulfonic acid.

16. The method of claim 13 in which said reactant is the trisodium salt of naphthalene trisulfonic acid.

17. The method of claim 13 in which the naphthalene sulfonic reactant is applied as an aqueous solution containing approximately 0.1 to 50 weight percent of such reactant.

18. The method of claim 17 in which such naphthalene sulfonic solution has a concentration of about 1 to 5 percent by weight.

19. The method of claim 13 in which said naphthalene sulfonic reactant includes approximately 1 to 50 weight percent of tartaric acid and the pH of such reactant is about 1 to 5.

20. The method of claim 13 in which a water-insoluble hydrophilic protective sublayer is provided on the support member prior to application of such diazo light-sensitive layer.

References Cited

UNITED STATES PATENTS

| | | | |
|---|---|---|---|
| 3,300,309 | 1/1967 | Chu | 117—34X |
| 3,219,447 | 11/1965 | Neugebauer et al. | 96—33 |
| 3,307,951 | 3/1967 | Adams et al. | 96—75X |
| 3,373,021 | 3/1968 | Adams et al. | 96—33 |

GEORGE F. LESMES, Primary Examiner

R. E. MARTIN, Assistant Examiner

U.S. Cl. X.R.

96—75, 91; 117—34, 62.1, 72, 74, 161; 260—141, 505; 148—6, 27